United States Patent [19]

Melton et al.

[11] Patent Number: 5,154,341
[45] Date of Patent: Oct. 13, 1992

[54] NONCOLLAPSING MULTISOLDER INTERCONNECTION

[75] Inventors: Cynthia M. Melton, Bolingbrook; Carl J. Raleigh, Cary; Steven Scheifers, Hoffman Estates, all of Ill.

[73] Assignee: Motorola Inc., Schaumburg, Ill.

[21] Appl. No.: 622,996

[22] Filed: Dec. 6, 1990

[51] Int. Cl.⁵ .............................................. H05K 3/34
[52] U.S. Cl. .................................. 228/180.2; 228/254
[58] Field of Search ...................... 228/180.2, 179, 208, 228/226, 246, 248, 254

[56] References Cited

U.S. PATENT DOCUMENTS

| | | | |
|---|---|---|---|
| 4,545,610 | 10/1985 | Lakritz et al. | |
| 4,739,917 | 4/1988 | Baker | 228/180.2 |
| 4,818,728 | 4/1989 | Rai et al. | 228/180.2 |
| 4,821,946 | 4/1989 | Abe et al. | 228/248 |
| 4,878,611 | 11/1989 | LoVasco et al. | |
| 4,914,814 | 4/1990 | Behun et al. | |
| 4,967,950 | 11/1990 | Legg et al. | 228/254 |
| 5,007,163 | 4/1991 | Pope et al. | 228/180.2 |

OTHER PUBLICATIONS

IBM Technical Disclosure Bulletin, "Copper Ball Standoff . . .", vol. 29, No. 4, p. 1646, Sep. 1986.
Research Disclosure, "Solder Column Extension", No. 260, Dec. 1985.
Koopman, N., "Solder Joining Technology", *Mat. Res. Soc. Symp. Proc.*, vol. 154, (1989), pp. 431–440.

*Primary Examiner*—Samuel M. Heinrich
*Attorney, Agent, or Firm*—Douglas D. Fekete

[57] ABSTRACT

An improved electrical component package comprises a component attached to a substrate by a plurality of multisolder interconnections. Each interconnection comprises a preformed spacer bump composed of a first solder alloy, preferably a lead-base tin alloy containing greater than 90 weight percent lead. The spacer bump is bonded to a metallic electrical contact of the component and rests against a corresponding metallic electrical contact of the substrate, but is not directly metallurgically bonded thereto. Each interconnection further comprises a sheath portion formed of a second compositionally distinct solder alloy having a liquidus temperature less than the first alloy solidus temperature. A preferred second solder is a tin-lead alloy comprising between about 30 and 50 weight percent lead and the balance tin or indium. The sheath is bonded to the spacer bump and to the substrate contact to complete attachment of the component to the substrate and preferably extends to the component contact, encasing the bump, to produce an interconnection having an hour glass configuration to reduce thermal fatigue stresses at the solder bonds to the contacts. A method for forming the multisolder interconnection is presented wherein the sheath is derived from a solder microball situated on the substrate contact in juxtaposition to the spacer bump for reflow.

4 Claims, 1 Drawing Sheet

NONCOLLAPSING MULTISOLDER INTERCONNECTION

BACKGROUND OF THE INVENTION

This invention relates to an electrical component package comprising a component attached to a substrate by a multisolder interconnection. More particularly, this invention relates to such interconnection comprising a spacer bump formed of a high reflow temperature solder alloy bonded to the component and set against the substrate to maintain a desired distance therebetween, and a securement portion formed of low reflow temperature solder alloy bonding the spacer bump to the substrate.

A common electrical component package comprises an electrical component mounted onto a substrate by a plurality of solder bump interconnections. Such interconnections are used, for example, for mounting a semiconductor chip onto a carrier, for mounting a chip carrier onto a printed circuit board, or for mounting a semiconductor chip directly onto a printed circuit board. In any event, the componenet has a generally planar interface that includes a plurality of discrete metal contacts disposed in an array or other suitable pattern. The substrate comprises a generally planar component attachment region that includes a plurality of metal contacts disposed in a pattern corresponding to the component contacts. With the component interface overlaying the substrate region, each component contact is individually connected to the corresponding substrate contact by a solder bump interconnection. A common method for forming a solder bump interconnection utilizes a microball composed of tin-lead solder alloy. The microball is placed onto the component contact, heated and cooled to reflow the alloy to form a bump and to bond the bump to the contact. The component is then assembled with the substrate so that the bump rests upon the corresponding substrate contact. The assembly is heated and cooled to bond the bump to the substrate contact. This attaches the component to the substrate and electrically connects the contacts for conducting electrical signals therebetween, with the component interface and the substrate region spaced apart by the solder bump.

The component and the substrate are generally formed of different materials. For example, the component may be a silicon chip or an alumina chip carrier, whereas the substrate may be a printed circuit board formed of a glass fiber-reinforced epoxy resin. These materials have significantly different coefficients of thermal expansion. During thermal cycling such as typically experienced by the package during operation, the component and the substrate tend to expand and contract, but at different rates. This mismatch creates stresses that tend to produce fatigue within the solder bonds and may result in catastrophic failure of the interconnection. It is desired to utilize a solder alloy having a high lead content, preferably greater than 90 percent, to produce a strong bond that resists thermal fatigue. However, high-lead solder alloys require reflow temperatures sufficient to cause thermal degradation of epoxy resin and are thus not suitable for printed circuit board substrates.

Also, during reflow onto the substrate, the solder bump tends to collapse under the weight of the component, creating a pancake configuration that tends to concentrate the thermal fatigue stresses at the solder bonds. It has been proposed to form an interconnection having an hour glass configuration to distribute the thermal fatigue stresses and thereby extend the useful life of the electrical component package. Furthermore, collapse of the solder bumps during assembly reduces the component-substrate gap and thereby restricts access for solvent cleaning or other post-interconnection operations.

SUMMARY OF THE INVENTION

In accordance with the preferred embodiment of this invention, these and other deficiencies are overcome by an electrical component package comprising a plurality of multisolder interconnections for mounting a component onto a substrate. The component is preferably formed of silicon, alumina or other heat resistant material and includes a generally planar interface comprising a plurality of discrete electrical contacts composed of solder-wettable copper metal. The substrate may be formed of epoxy resin or other material susceptible to thermal degradation at elevated temperature and includes a generally planar component attachment region that comprises a plurality of discrete solder-wettable electrical contacts arranged in a superimposable pattern relative to the component contacts. In the package, the component interface overlies the substrate region in parallel spaced relationship with each pair of contacts joined by a multisolder interconnection. Each interconnection comprises a spacer bump and a sheath portion. The spacer bump is formed of a first solder alloy having a predetermined solidus temperature. As used herein, solidus temperature refers to the temperature below which the alloy exits as a solid phase and above which there is incipient melting of the alloy. The spacer bump is metallurgically bonded to the component contact and rests against the substrate contact, but is not metallurgically bonded directly thereto. In this manner, the spacer bump separates the component and the substrate by a desired distance. The interconnection further comprises a sheath formed of a second solder alloy having a liquidus temperature less than the first alloy solidus temperature. As used herein-liquidus temperature refers to the temperature above which the alloy exists as a uniform liquid phase suitable for reflow to create a solder bond. The sheath is metallurgically bonded to the substrate contact and also to the spacer bump. In this manner, the spacer bump and the sheath cooperate to affix the component to the substrate and to electrically connect the contacts. The sheath preferably encases the core bump and extends to the component contact, imparting to the interconnection an hour glass configuration of the type believed to be effective for distributing thermal fatigue stresses.

In one aspect of this invention, the spacer bump is formed of a lead-base tin alloy, preferably containing greater than 90 percent lead, for forming a strong metallurgical bond to a contact of a component formed of a heat resistant material. In contrast, the sheath is formed of an alloy having a reduced lead content, preferably 30 to 50 weight percent, and the balance tin or indium, and having a liquidus temperature sufficiently low for reflow to epoxy substrates. Thus, this invention combines the advantages of a strong high-lead solder bond to a heat resistant component without the disadvantages of thermal degradation of an epoxy substrate, while nevertheless achieving an optimum solder bond to the epoxy substrate contact.

This invention also provides a method for forming the multisolder interconnections. In a preferred embodiment, a microball of the first solder alloy is reflowed onto a component contact to produce the spacer bump. The microball diameter may be selected, and the spread of the alloy onto the component contact may be controlled, to obtain a predetermined bump height perpendicular to the component interface. Alternately, the bump may be adjusted during reflow by pressing against a nonwettable surface spaced a predetermined distance from the interface. A second microball which is composed of the second alloy is positioned on the corresponding substrate contact and has a height less than the first bump height. The component and the substrate with the bumps are assembled with the first bump resting upon the substrate contact adjacent the second microball. The assembly is heated at a temperature above the second alloy liquidus temperature, but below the first alloy solidus temperature, to reflow the second alloy while maintaining the first alloy in a solid condition. The second alloy forms a liquid phase that spreads onto the substrate contact and is drawn about the spacer bump, wetting the surface of the spacer bump. Upon cooling, the second alloy metallurgically bonds to the spacer bump and to the substrate contact, thereby forming the sheath and completing attachment of the component to the substrate.

Thus, this invention provides an electrical component package comprising a component attached to a substrate by a plurality of multisolder interconnections. During assembly, the spacer bumps maintain the component separated from the substrate by a distance corresponding to the predetermined height of the spacer bump to prevent collapse of the type that would otherwise produce a pancake interconnection. This provides an optimum gap between the component and the substrate for facilitating subsequent operations such as solvent cleaning. Moreover, this produces an hour glass interconnection to better distribute stresses due to thermal expansion mismatch between the component and the substrate materials. The multisolder interconnection of this invention produces a strong high-lead solder bond to the component contact without degradation of the substrate, and further features an optimum solder bond to the substrate contact, including a high surface area intimate solder bond between the spacer bump and the sheath. Accordingly this invention provides a strong interconnection to affix the component to the substrate and to resist failure due to thermal fatigue stresses, thereby extending the useful life of the interconnection and thus of the package.

DESCRIPTION OF THE DRAWINGS

The present invention will be further illustrated with reference to the accompanying drawings wherein.

DETAILED DESCRIPTION OF THE INVENTION

Figure 1:
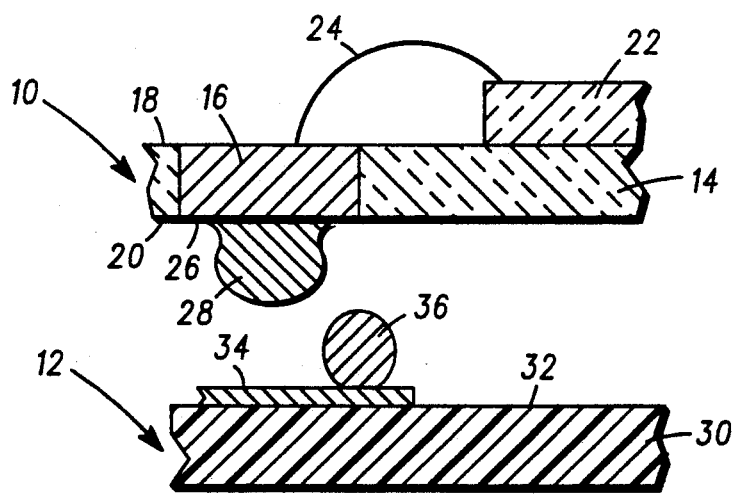
FIG. 1 is a cross-sectional view of a component and a substrate shown individually and prior to assembly for attachment by a multisolder interconnection in accordance with this invention.

Referring to the figures, in a preferred embodiment, this invention is employed for attaching a component which is a semiconductor chip carrier 10 to a substrate which is a printed circuit (PC) board 12. FIG. 1 shows carrier 10 and PC board 12 prior to assembly. Carrier 10 is formed of an alumina panel 14 and includes a through-conductor 16 composed of a high temperature resistant, electrically conductive metal such as tungsten, titanium, chromium or copper. Carrier 10 has opposite major surfaces comprising upperface 18 and interface 20. An integrated circuit chip 22 is mounted onto upperface 18 and connected to through-conductor 16 at upperface 18 by wire bond 24. Through-conductor 16 includes an electrical contact 26 at interface 20. Contact 26 is coated with a copper plate that is wettable by lead-tin solder. In preparation for attachment to PC board 12 in accordance with this invention, a bump 28 formed of a high-lead solder alloy is bonded to contact 26. Bump 28 is composed of about 5 percent tin and the balance lead and exhibits a solidus temperature of greater than 310° C. and a liquidus temperature greater than about 325° C. Bump 28 is preferably formed from a microball of the solder alloy having a diameter of about 0.084 centimeters. With carrier 10 oriented so that interface 20 faces upward, a fugitive, tacky coat of a mildly activated rosin flux is applied to contact 26. A singular solder microball is set upon contact 26 and held by the flux coat. The carrier and solder ball are then heated in a nitrogen atmosphere to a temperature above about 340° C. and held for about 40 seconds, sufficient to liquify the solder alloy. Enhanced by the flux, the liquid solder alloy wets the copper metal and spreads onto contact 26. The carrier preassembly is cooled to solidify the solder alloy and form bump 28. Bump 28 is solder bonded to contact 26 and exhibits a height of about 0.069 centimeters.

PC board 12 comprises an FR4 card 30 formed of reinforcing glass fiber lamellae impregnated with an epoxy resin. Board 12 includes generally planar region 32, depicted in the figures, adapted for attachment of carrier 10, and carrying a plated copper contact 34. Contact 34 communicates with electrical circuit features elsewhere on printed circuit board 12 and, through the interconnection made in accordance with this invention, is adapted for conveying electrical signals to and from integrated circuit chip 22 for processing. A microball 36 formed of a low-lead solder alloy is placed onto pad 34 prior to assembly and soldering operations. Microball 36 preferably has a diameter of about 0.051 centimeters and is formed of a neareutectic alloy comprising about 40 weight percent lead and the balance tin and having a liquidus temperature of about 188° C. Microball 36 is held in position by a tacky, fugitive rosin flux coat (not shown) applied to contact 34 prior to placement of microball 36 to promote wetting during subsequent solder operations.

Figure 2:
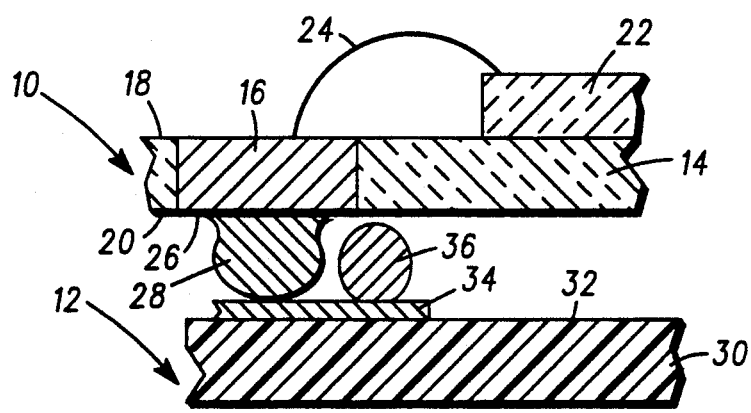
FIG. 2 is a cross-sectional view of the component and the substrate in FIG. 1 assembled in readiness for attachment by a multisolder interconnection in accordance with this invention.

In preparation for attachment of carrier 10 to PC board 12, the carrier and the board are arranged in the assembly shown in FIG. 2 with carrier 10 overlying board region 32 and bump 28 resting upon contact 34 adjacent microball 36. In this assembly, carrier interface 20 faces and parallels board region 32, but is spaced apart by bump 28. The assembly is heated to a temperature of about 203° C., above the liquidus temperature of solder alloy 36 but below the solidus temperature of bump alloy 28, and maintained at the temperature for about 60 seconds. During this time, the solder alloy of microball 36 is liquified and wets contact 34, assisted by the flux, causing the alloy to spread. The low-lead solder also wets bump 28 and contact 26, so that the spreading alloy is drawn about the bump by surface tension forces. Thereafter, the assembly is cooled to ambient temperature to resolidify the low-lead solder alloy and complete attachment of carrier 10 to PC board 30.

Figure 3:
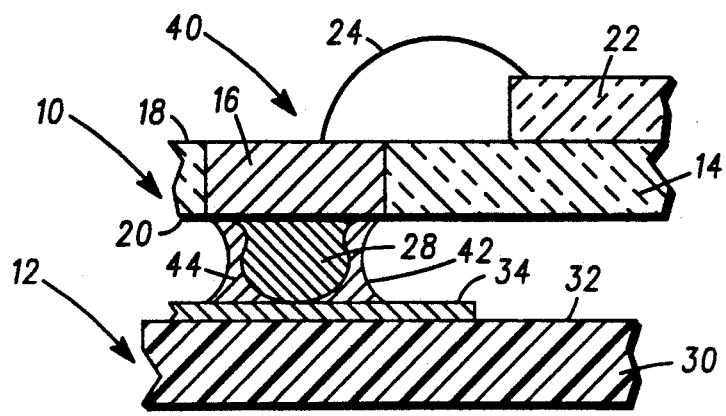
FIG. 3 is a cross-sectional view of an electrical component package derived from the assembly in FIG. 2 and comprising a multisolder interconnection in accordance with this invention.

The product electrical component package 40 is depicted in FIG. 3 and comprises a multisolder interconnection 42 affixing semiconductor chip carrier 10 to PC board 12 and also electrically connecting board contact 34 to carrier contact 26, and thus through through-conductor 16 and wire bond 24 to integrated circuit chip 22. Interconnection 42 comprises a spacer bump 28 formed of the high-lead solder alloy and a sheath portion 44 formed of the low-lead solder alloy. Interconnection 42 is substantially strengthened by the intimate metallurgical bond formed between the high-lead alloy spacer bump 28 and carrier contact 26, which was formed without thermal degradation of the epoxy base 30 despite the high temperatures required to reflow the high-lead solder. Sheath 44 is metallurgically bonded to board contact 34 and to spacer bump 28, and further extends about bump 28 to carrier contact 26, thereby providing a strong mechanical joint between carrier 10 and PC board 12. In addition, interconnection 42 features an overall hourglass configuration that provides increased bond surface area at carrier contact 26 and board contact 34 but a reduced cross-sectional area therebetween to better distribute thermal fatigue stresses. Thus, this invention provides a multi-solder interconnection that resists breakage during thermal cycling such as experienced by the package during operation and thereby extends the useful life of the package. In addition, the spacer bump remains solid during the reflow of the low-lead solder alloy to prevent collapse of the interconnection and thereby not only achieve the desired hourglass configuration, but also provide an optimum spacing between component 10 and PC board 12 to facilitate post-interconnection processing such as cleaning or polymer encapsulation.

Although this invention is illustrated in the figures for a single interconnection, a typical electrical package comprises a plurality of laterally discrete interconnections. That is, carrier 10 commonly includes a plurality of contacts 26 disposed in an array or other suitable pattern, while board region 32 carries a plurality of contacts 34. This invention is particularly well suited for simultaneously forming a plurality of multisolder interconnections, each interconnect joining an individual contact on the carrier to an individual contact on the substrate.

In the described embodiment, a desired spacer bump height, and thus a desired height of the resulting gap between the component and the substrate, was obtained by selecting an appropriate microball diameter and controlling reflow onto the component contact. One advantage of this invention is that electrical and mechanical connection is assured for each of a plurality of interconnections by the flow of the sheath alloy about the spacer bump despite variations in the bump heights which may prevent an individual bump from direct contact with the substrate contact. In an alternate embodiment, the spacer bumps may be sized to a predetermined, uniform height by forming the alloy during reflow against a flat surface positioned a precise distance from the component and composed of material that does not bond to the solder alloy so as to permit the forming surface to be separated from the bump following solidification of the alloy. An additional advantage of this presizing step is that it provides a flat region on the bump for resting against the substrate contact.

While this invention has been described for a particular package comprising a chip carrier and a substrate, this invention may be suitably employed for forming multisolder interconnections between other components and other substrates. For example, a multisolder interconnection may be formed for attaching a semiconductor chip by a flip-chip process to a carrier or alternately directly to a printed circuit board. In particular, this invention is well suited for forming an interconnection between a high temperature resistant component and a substrate formed of a material that is susceptible to thermal degradation, such as an epoxy resin of a printed circuit board, to provide the advantages of a high temperature solder bond without degradation of the substrate.

In the described embodiment, a multisolder interconnection comprises a bump composed of high-lead solder alloy and a sheath composed of a low-lead solder alloy. In general, the spacer bump may be formed of a lead-base alloy suitable for bonding to the component contact and having a predetermined solidus temperature. The sheath may be formed of a solder alloy that wets the substrate contact and also the spacer bump for forming the necessary solder bonds, and further that has a liquidus temperature less than the bump alloy solidus temperature to permit reflow without incipient liquification of the bump. Preferably, the bump alloy contains greater than 90 weight percent lead and the balance tin. Suitable alloys for the sheath include alloys of lead with indium or tin. In general, for epoxy-base substrates, alloys containing between about 30 and 50 weight percent lead are preferred to provide a maximum lead content while permitting reflow at temperatures suitably low to avoid degradation of the substrate. In addition to microballs of 40 lead-60 tin alloy employed in the described embodiment, microballs of solder alloy containing 30 weight percent lead and the balance indium are commercially available and well suited for forming the sheath in accordance with the invention.

While this invention has been described in terms of certain embodiments thereof, it is not intended that it be limited to the above description but rather only to the extent set forth in the claims that follow.

The embodiments of the invention in which an exclusive property or privileges claimed and defined are as follows:

1. A method for forming a multisolder interconnection attaching a component and a substrate, said component having a planar interface comprising a metallic electrical contact, said substrate having a planar component attachment region comprising a metallic electrical contact, said method comprising
bonding to the component contact a spacer bump formed of a first solder alloy having a predetermined solidus temperature and having a height perpendicular to said component interface,
placing onto the substrate contact a microball formed of a second solder alloy solderable to said first solder alloy and having a liquidus temperature less than said first alloy solidus temperature, said microball having a height perpendicular to the second region less than the spacer bump height.

assembling the component and the substrate such that said component interface overlies said substrate region and the spacer bump rests upon the substrate contact is juxtaposition to the microball, whereupon the component interface is spaced from the substrate region by the spacer bump, heating the assembly above said second alloy solidus temperature and below said first alloy liquidus temperature to liquify the second solder alloy, whereupon the liquid second alloy flows about the first bump adjacent the substrate contact, whereby during said heating the spacer bump remains solid to prevent collapse of the assembly, and cooling the assembly to solidify the second solder alloy and thereby bond the first bump to the second contact to complete attachment of the component to the substrate.

2. A method for forming a plurality of multisolder interconnections attaching a component to a substrate, said substrate having a generally planar component attachment region comprising a plurality of metallic electrical contacts disposed in a pattern, said substrate having a generally planar interface comprising a plurality of metallic electrical contacts disposed in a pattern superimposable onto the substrate contact pattern, said method comprising bonding to each said component contact a spacer bump formed of a first solder alloy having a predetermined liquidus temperature and having a height perpendicular to said first contact, stationing on each said substrate contact a solder microball formed of a second solder alloy suitable for soldering to said first solder alloy and having a predetermined solidus temperature less than said first alloy liquidus temperature, said microball having a height perpendicular to the second contact less than the spacer bump height, assembling the component and said substrate such that said component interface overlies said substrate region with each spacer bump resting upon a corresponding substrate contact in juxtaposition to the second bump, whereupon the component interface is spaced apart from the substrate region by said spacer bump, heating said assembly above said second alloy solidus temperature and below said first alloy liquidus temperature to liquify the second solder alloy, whereupon the liquid second alloy spreads onto the substrate contact and is drawn about the spacer bump, and cooling the assembly to solidify the second solder alloy and thereby bond the spacer bump to the substrate contact to attach the component to the substrate and to electrically connect the electrical contacts thereof.

3. The method of claim 2 wherein the first solder alloy comprises greater than about 90 weight percent lead and said second alloy comprises between about 30 and 50 weight percent lead and the balance mainly selected from the group of tin and indium.

4. The method of claim 2 wherein the component is a semiconductor chip carrier formed of a high temperature resistant ceramic material and the substrate is a printed circuit board comprising an epoxy-base material thermally degradable at the first alloy liquidus temperature.

* * * * *